United States Patent
Chen et al.

(10) Patent No.: US 12,347,483 B2
(45) Date of Patent: *Jul. 1, 2025

(54) ARRANGEMENTS OF MEMORY DEVICES AND METHODS OF OPERATING THE MEMORY DEVICES

(71) Applicant: Taiwan Semiconductor Manufacturing Company, Ltd., Hsinchu (TW)

(72) Inventors: Chien-Yuan Chen, Hsinchu (TW); Hau-Tai Shieh, Hsinchu (TW); Cheng Hung Lee, Hsinchu (TW); Hung-Jen Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/446,072

(22) Filed: Aug. 8, 2023

(65) Prior Publication Data

US 2023/0386567 A1   Nov. 30, 2023

Related U.S. Application Data

(63) Continuation of application No. 17/313,179, filed on May 6, 2021, now Pat. No. 11,817,144.

(51) Int. Cl.
   *G11C 11/419* (2006.01)
   *G11C 11/412* (2006.01)

(52) U.S. Cl.
   CPC .......... *G11C 11/419* (2013.01); *G11C 11/412* (2013.01)

(58) Field of Classification Search
   CPC ........................... G11C 11/419; G11C 11/412
   (Continued)

(56) References Cited

U.S. PATENT DOCUMENTS 5,657,265 A * 8/1997 Yoo ..................... G11C 7/10
                                                    365/230.03
6,110,221 A * 8/2000 Pai ...................... G06F 30/39
                                                    326/82
(Continued)

FOREIGN PATENT DOCUMENTS

TW   201814704 A   4/2018
TW     1698864 B   7/2020

OTHER PUBLICATIONS

Final Office Action on U.S. Appl. No. 17/313,179 DTD Nov. 29, 2022.
(Continued)

*Primary Examiner* — Sung Il Cho
(74) *Attorney, Agent, or Firm* — FOLEY & LARDNER LLP (57) ABSTRACT

A memory device and a method of operating the same are disclosed. In one aspect, the memory device includes a plurality of memory arrays and a controller including a plurality of buffers including a first buffer connected to a first memory array and a second buffer connected to a second memory array. The first and second memory arrays are disposed on opposing sides of the controller. The memory device can include a first wire extending in a first direction and connected to the first buffer, a second wire extending in the first direction and connected to the second buffer, and a third wire connected to the first and second wires and extending in a second direction that is substantially perpendicular to the first direction. The third wire can be electrically connected to the controller, and respective lengths of the first wire and the second wire are substantially the same.

20 Claims, 7 Drawing Sheets

(58) Field of Classification Search
USPC .......................................................... 365/156
See application file for complete search history.

(56) References Cited

U.S. PATENT DOCUMENTS

| | | | | |
|---|---|---|---|---|
| 6,195,305 | B1* | 2/2001 | Fujisawa | G11C 5/147 |
| | | | | 365/226 |
| 9,069,662 | B2 | 6/2015 | Miura | |
| 2002/0001215 | A1* | 1/2002 | Fujisawa | G11C 5/063 |
| | | | | 365/51 |
| 2009/0316465 | A1* | 12/2009 | Jain | G11C 8/08 |
| | | | | 365/194 |
| 2012/0159076 | A1* | 6/2012 | Tanpure | G11C 5/025 |
| | | | | 711/125 |
| 2015/0049568 | A1 | 2/2015 | Thyagarajan et al. | |
| 2022/0208234 | A1 | 6/2022 | Schreiber et al. | |

OTHER PUBLICATIONS

Non-Final Office Action on U.S. Appl. No. 17/313,179 DTD Mar. 17, 2023.
Non-Final Office Action on U.S. Appl. No. 17/313,179 DTD Aug. 1, 2022.
Notice of Allowance on U.S. Appl. No. 17/313,179 DTD Jul. 3, 2023.
Office Action issued in connection with Taiwan Appl. No. 110130754 dated Jan. 17, 2025.

\* cited by examiner

ARRANGEMENTS OF MEMORY DEVICES AND METHODS OF OPERATING THE MEMORY DEVICES

CROSS-REFERENCE TO RELATED APPLICATION

This application is a continuation of U.S. patent application Ser. No. 17/313,179, filed May 6, 2021, and titled "MEMORY DEVICES AND METHODS OF OPERATING THE SAME," the entire contents of which are incorporated herein by reference for all purposes.

BACKGROUND

A static random access memory (SRAM) device is a type of volatile semiconductor memory that stores data bits using bistable circuitry that does not need refreshing. An SRAM device typically includes one or more memory arrays, wherein each array includes a plurality of SRAM cells. An SRAM cell is typically referred to as a bit cell because it stores one bit of information, represented by the logic state of two cross coupled inverters. Each memory array includes multiple bit cells arranged in rows and columns. Each bit cell in a memory array typically includes connections to a power supply voltage and to a reference voltage. Logic signals on bit lines control reading from and writing to a bit cell, with a word line controlling connections of the bit lines to the inverters, which otherwise float. A word line may be coupled to plural bit cells along a row of a memory array, with different word lines provided for different rows.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For each technology node, it is desirable for semiconductor devices including memory devices to be optimized for performance, power, and area (PPA). That is, a designer wants high performance (faster switching speeds, low delays, etc.), low power consumption, and low area usage. Balancing these metrics can be challenging because increasing the performance can, for example, result in large area usage or high-power consumption.

In general, for memory devices, various control signals are transmitted to and received from memory cells of the device in order to write into and read data (e.g., word line signal, bit line signal, sense amplifier enable signal, etc.). A memory device including SRAM devices includes arrays of SRAM memory cells which are arranged in rows and columns, where each column is connected to a sense amplifier. The sense amplifier can amplify a datum (or data) that is read from a memory cell in the corresponding column so that a controller connected to the sense amplifier can accurately read the data from the memory cell. At high speeds, there are timing constraints that need to be satisfied in order for data to be securely written into and read from the SRAM device. If these timing constraints are not properly satisfied, the data that gets written into the SRAM device can get corrupted, which would make the memory device unreliable. One area of concern for meeting timing requirements for memory devices is delays caused by wires (e.g., RC delay). Although wires are conductive, they have inherent characteristics that cause delays in the signal transfers. Therefore, it is critical that the layout of the memory device is optimized for low delays.

The present disclosure relates to having an SRAM memory device with a layout that reduces wire delays. A memory device can have a butterfly structure where banks (or arrays) of SRAM devices are formed on opposite sides of a controller. A signal that is output from the controller is a sense amplifier enable (SAE) signal which is an input to the sense amplifiers that are connected to the columns of memory devices. This signal is split into two so that one goes to the left bank and the other goes to the right bank. Typically, an SAE signal generator is not located in the center but skewed towards one of the memory banks, which requires the SAE signal to be split at a location that is skewed towards one of the memory banks as well. This can result in additional wire delays for the SAE signal and an unbalanced delivery of the SAE signal to the left and right banks. In the present disclosure, the wires that carry the SAE signal have the same length so that the delay between the left and right banks for the SAE signal is minimized.

Figure 1:
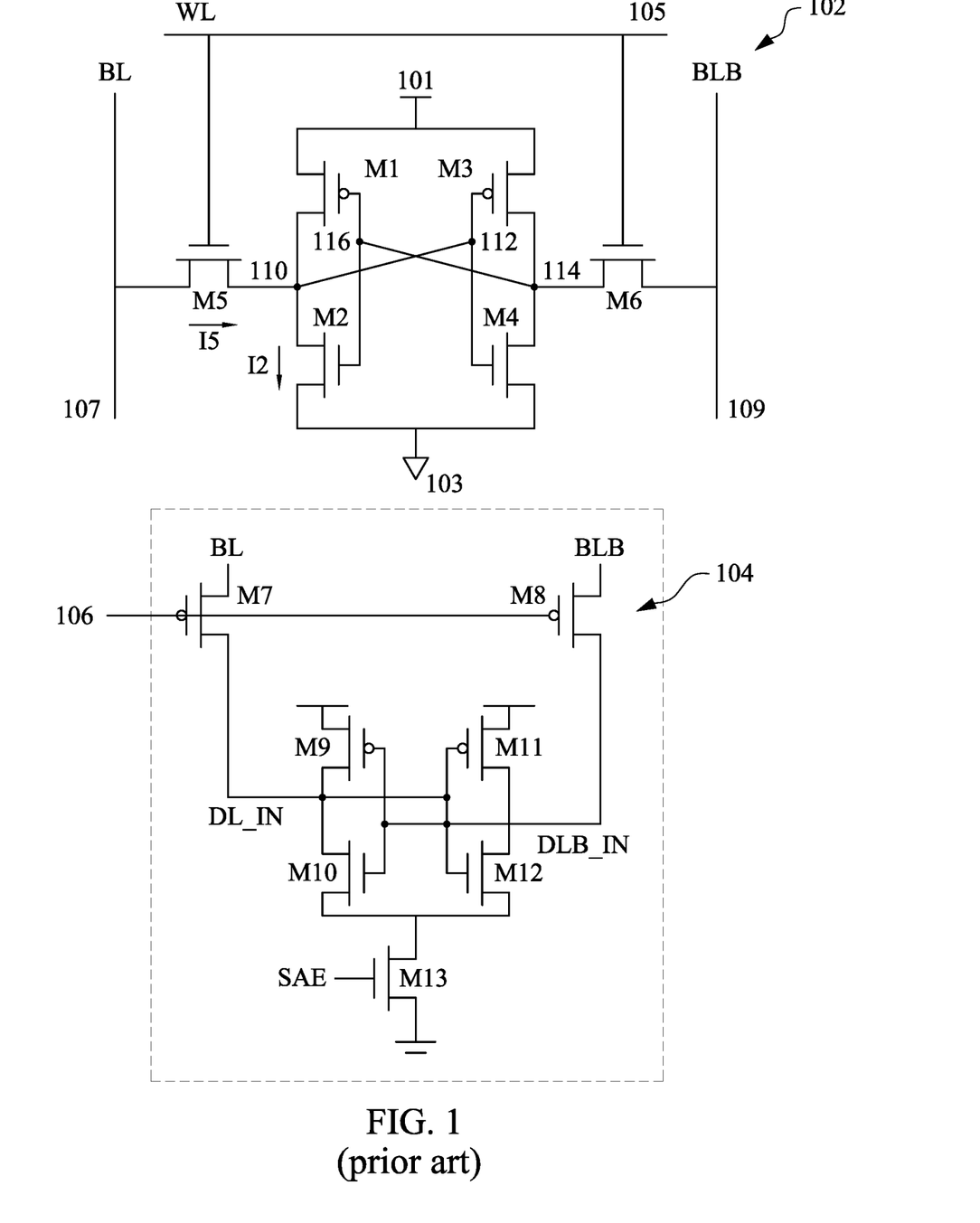
FIG. 1 illustrates an example circuit diagram of a memory cell and a sense amplifier, in accordance with some embodiments.

FIG. 1 illustrates an example circuit diagram of a memory cell 202 and a sense amplifier 204, in accordance with some embodiments. The memory cell 202 includes six transistors that form a typical 6T SRAM memory cell. In some embodiments, the memory cell 202 may be implemented as any of various other SRAM cells such as, for example, a two-transistor-two-resistor (2T-2R) SRAM cell, a four-transistor (4T)-SRAM cell, an eight-transistor (8T)-SRAM cell, a ten-transistor (10T)-SRAM cell, etc. Although the discussion of the current disclosure is directed to an SRAM cell, it is understood that other embodiments of the current disclosure can also be used in any of other memory cells such as, for example, dynamic random access (DRAM) memory cells.

As shown in FIG. 1, the memory cell 102 includes 6 transistors: M1, M2, M3, M4, M5, and M6. The transistors M1 and M2 are formed as a first inverter and the transistors M3 and M4 are formed as a second inverter, wherein the first and second inverters are cross coupled to each other. Specifically, the first and second inverters are each coupled between first voltage reference 101 and second voltage reference 103. In some embodiments, the first voltage reference 101 is a voltage level of a supply voltage applied to the memory cell 100, which is typically referred to as "Vdd." The second voltage reference 103 is typically referred to as "ground." The first inverter (formed by the transistors M1 and M2) is coupled to the transistor M5, and the second inverter (formed by the transistors M3 and M4) is coupled to the transistor M6. In addition to being coupled to the first and second inverters, the transistors M5 and M6 are each coupled to a word line (WL) 105 and are coupled to a bit line (BL) 107 and a bit line bar 109 (BLB), respectively.

In some embodiments, the transistors M1 and M3 are referred to as pull-up transistors of the memory cell 102 (hereinafter "pull-up transistor M1" and "pull-up transistor M3," respectively); the transistors M2 and M4 are referred to as pull-down transistors of the memory cell 102 (hereinafter "pull-down transistor M2" and "pull-down transistor M4," respectively); and the transistors M5 and M6 are referred to as access transistors of the memory cell 102 (hereinafter "access transistor M5" and "access transistor M6," respectively). In some embodiments, the transistors M2, M4, M5, and M6 each includes an n-type metal-oxide-semiconductor (NMOS) transistor, and M1 and M3 each includes a p-type metal-oxide-semiconductor (PMOS) transistor. Although the illustrated embodiment of FIG. 1 shows that the transistors M1-M6 are either NMOS or PMOS transistors, any of a variety of transistors or devices that are suitable for use in a memory device may be implemented as at least one of the transistors M1-M6 such as, for example, a bipolar junction transistor (BJT), a high-electron-mobility transistor (HEMT), etc.

The access transistors M5 and M6 each has a gate coupled to the WL 105. The gates of the transistors M5 and M6 are configured to receive a pulse signal, through the WL 105, to allow or block an access of the memory cell 102 accordingly, which will be discussed in further detail below. The transistors M2 and M5 are coupled to each other at node 110 with the transistor M2's drain and the transistor M5's source. The node 110 is further coupled to a drain of the transistor M1 and node 112. The transistors M4 and M6 are coupled to each other at node 114 with the transistor M4's drain and the transistor M6's source. The node 114 is further coupled to a drain of the transistor M3 and node 116.

When a memory cell (e.g., the memory cell 102) stores a data bit, a first node of the bit cell is configured to be at a first logical state (either a logical 1 or a logical 0), and a second node of the bit cell is configured to be at a second logical state (either a logical 0 or a logical 1). The first and second logical states are complementary with each other. In some embodiments, the first logical state at the first node may represent the logical state of the data bit stored in the memory cell. For example, in the illustrated embodiment of FIG. 1, when the memory cell 102 store a data bit at a logical 1 state, the node 110 is configured to be at the logical 1 state, and the node 114 is configured to be at the logical 0 state.

To read the logical state of the data bit stored in the memory cell 102, the BL 107 and BLB 109 are pre-charged to Vdd (e.g., a logical high). Then the WL 105 is asserted, or activated, by an assert signal to a logical high, which turns on the access transistors M5 and M6. Specifically, a rising edge of the assert signal is received at the gates of the access transistors M5 and M6, respectively, so as to turn on the access transistors M5 and M6. Once the access transistors M5 and M6 are turned on, based on the logical state of the data bit, the pre-charged BL 107 or BLB 109 may start to be discharged. For example, when the memory cell 102 stores a logical 0, the node 110 may present a voltage corresponding to the logical 0, and the node 114 may present a voltage corresponding to the complementary logical 1. In response to the access transistors M5 and M6 being turned on, a discharge path, starting from the pre-charged BL 107, through the access transistor M5 and pull-down transistor M2, and to ground 103, may be provided. Along the discharge path, the access transistor M5 and the pull-down transistor M6 may conduct current I5 and current I2, respectively. While the voltage level on the BL 107 is pulled down by such a discharge path, the pull-down transistor M4 may remain turned off. As such, the BL 107 and the BLB 109 may respectively present a voltage level to produce a large enough voltage difference between the BL 107 and BLB 109. Accordingly, the sense amplifier 104, coupled to the BL 107 and BLB 109, can use a polarity of the voltage difference to determine whether the logical state of the data bit is a logical 1 or a logical 0.

The sense amplifier 104, coupled to the BL 107 and BLB 109, can amplify a logical 1 or a logical 0 that is read from the memory cell 102. The sense amplifier 104 can include transistors M7, M8, M9, M10, M11, M12, and M13. The transistors M7-M9 and M11 are PMOS transistors, and M10, M12, and M13 are NMOS transistors. Although the illustrated embodiment of FIG. 1 shows that the transistors M7-M13 are either NMOS or PMOS transistors, any of a variety of transistors or devices that are suitable for use in a memory device may be implemented as at least one of the transistors M7-M13 such as, for example, a bipolar junction transistor (BJT), a high-electron-mobility transistor (HEMT), etc.

A read column select line 106 can be input to the transistors M7 and M8 and be used to select the column of memory cells in which the sense amplifier 104 is used. The transistors M9 and M10 form a third inverter, and transistors M11 and M12 form a fourth inverter. The third and fourth inverters are cross coupled. So, an input to the third inverter is inverted at the output, and an input to the fourth inverter (output of the third inverter) is inverted at the output of the fourth inverter. When the column including the sense amplifier 104 is selected via the read column select line 106, a data signal from the BL 107 can be transferred to a DL_IN node, and the inverse of the data signal can be transferred to the DLB_IN node via BLB 109.

The sense amplifier enable (SAE) signal can be transferred to the transistor M13. The transistor M13 can function as an enable transistor that can activate or deactivate the sense amplifier 104. Accordingly, if a turn-on voltage is transmitted to the gate of the transistor M13, the sense amplifier 104 is activated so that the signals on the BL 107 and BLB 109 can be sensed. If the turn-on voltage is not transmitted to the gate of the transistor M13, the sense amplifier is deactivated, and the data transferred on the BL 107 and BLB 109 are not read.

Figure 2:
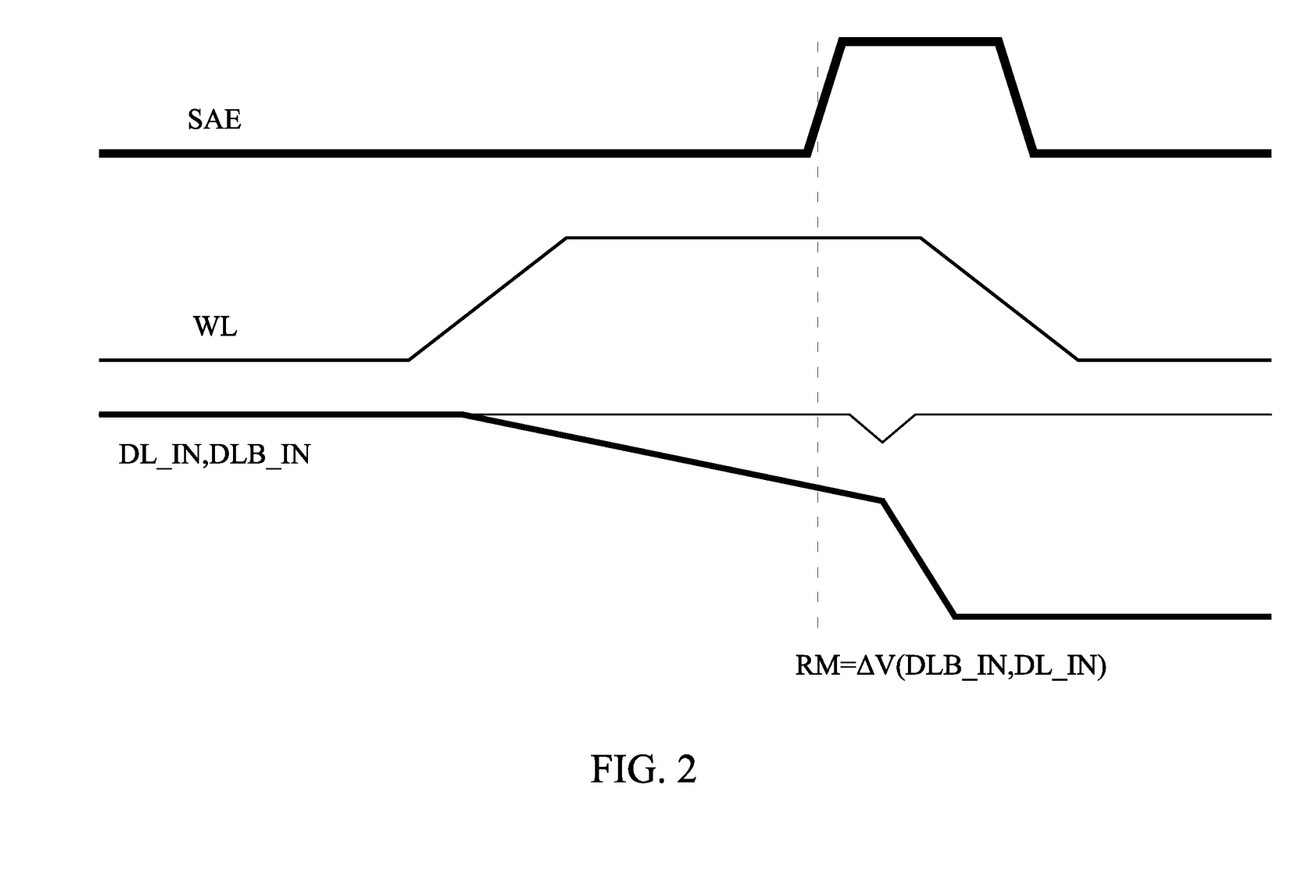
FIG. 2 illustrates timing constraints of designing a memory cell, in accordance with some embodiments.

FIG. 2 illustrates timing constraints of designing the memory device, in accordance with some embodiments. The lines "SAE," "WL," "DL_IN," and "DLB_IN" show the relative timing of when the different signals have to be switched in order for the data within the memory cell 102 can be read reliably. Although the lines have certain slopes and angles, this is for illustrative and simplicity purposes only and the actual shape of the lines may vary.

As discussed above, PPA is an important metric to optimize as technology nodes advance. For a memory device such as an SRAM device, the Tcd value is an important index for performance. Tcd is the time it takes for a clock signal to arrive, for example, at a controller and for data to be read from the memory cell. In SRAM memory cells, the Tcd is dependent on the SAE signal and a read margin, which is the difference in voltage between the voltage at node DL_IN and voltage at node DLB_IN. In order for the data to be read properly, the SAE has to rise or go from logical 0 to logical 1 when there is enough of a voltage difference between the DL_IN and DLB_IN (RM). For example, if the SAE rises too early and thus activates the sense amplifier 104 too early, the DL_IN and DLB_IN might not have enough of a voltage difference to enable the cross-coupled inverters (third and fourth inverters) to stabilize the DL_IN and DLB_IN to have opposite logical states (i.e., DL_IN has logical 0 and DLB_IN has logical 1, or DL_IN has logical 1 and DLB_IN has logical 0). This can cause the data for the memory cell 102 to be read improperly. But if the SAE rises too late, Tcd will be too long, which would degrade the performance of the memory device.

Figure 3:
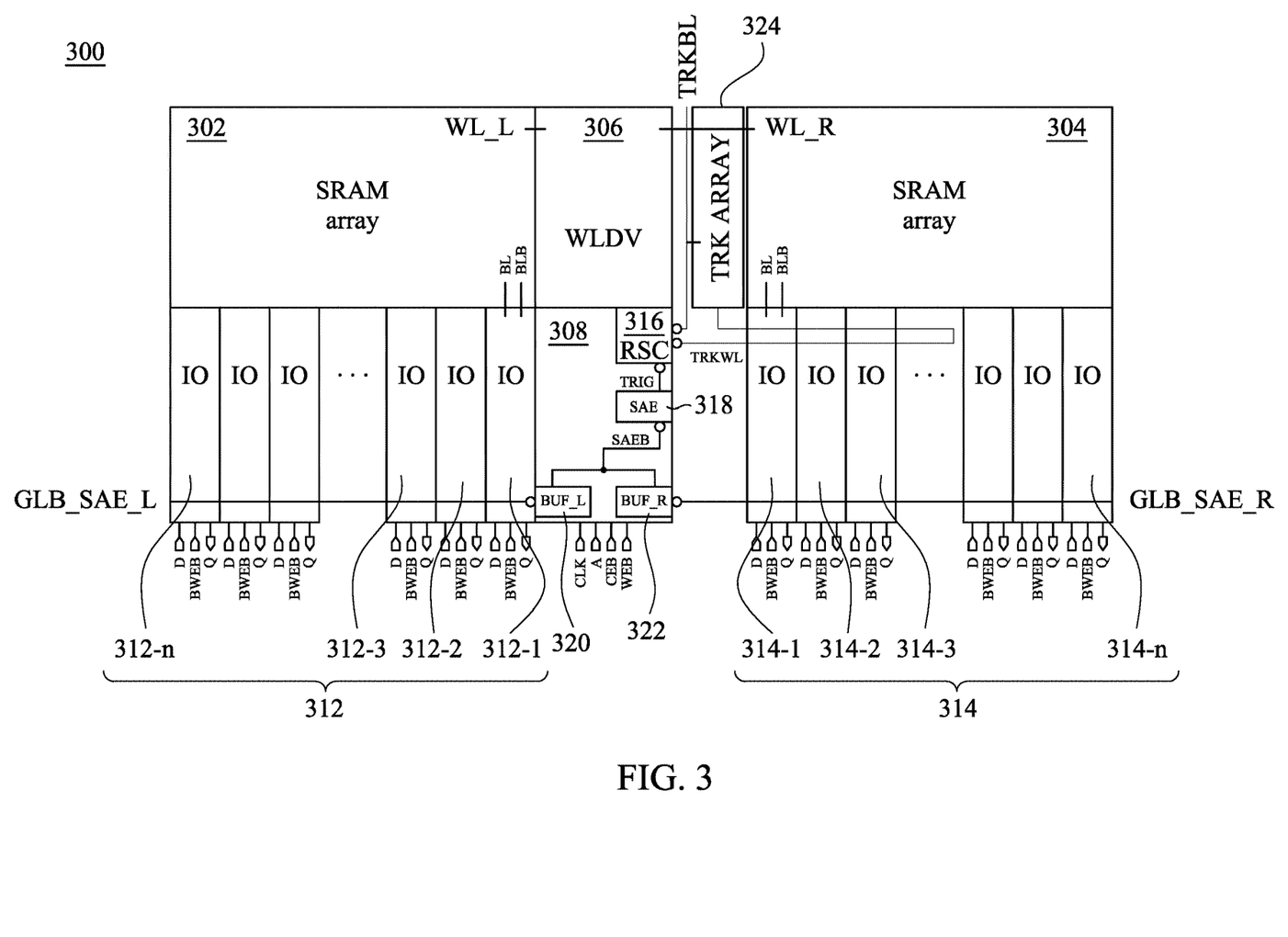
FIG. 3 illustrates an example block diagram of a memory device, in accordance with some embodiments.

FIG. 3 illustrates an example block diagram of a memory device 300, in accordance with some embodiments. The memory device 300 includes memory arrays 302 and 304, a word line driver 306, a main controller 308, and input/output (I/O) circuits 312 and 314. The main controller 308 includes the reset clock generator 316, an SAE signal generator 318, a left buffer 320, and a right buffer 322. The memory device 400 can further include a tracking array 324, which may or may not be part of any of the memory arrays 302 or 304, in some embodiments. The word line driver 306, the main controller 308, and/or the tracking array 324 can be collectively called the controller in the present disclosure. One of ordinary skill will recognize that the example block diagram in FIG. 3 does not include several signal lines and/or circuits that can be implemented as part of the memory device 300 and these signal lines and/or circuits have been omitted for clarity and simplicity.

The memory banks 302 and 304 can include arrays of SRAM memory cells 102 that are arranged in rows and columns. The memory banks 302 and 304 can be disposed on opposing sides of the word line driver 306.

The word line driver 306 generates word line signals WL_L and WL_R. The word line signal WL_L can be used to activate a word line on the memory bank 302, and the word line WL_R can be used to activate a word line on the memory bank 304. Although it is shown that only a certain number of signals or lines are formed (e.g., one word line signal WL_L), embodiments are not limited thereto, and one or more signal or signal lines can be formed. For example, a plurality of word line signals WL_L can be formed for the memory bank 302 so that each word line signal WL_L can activate a word line for a row. So, if there are 1024 rows of SRAM memory cells, there can be 1024-word line signals WL_L.

Figure 4:
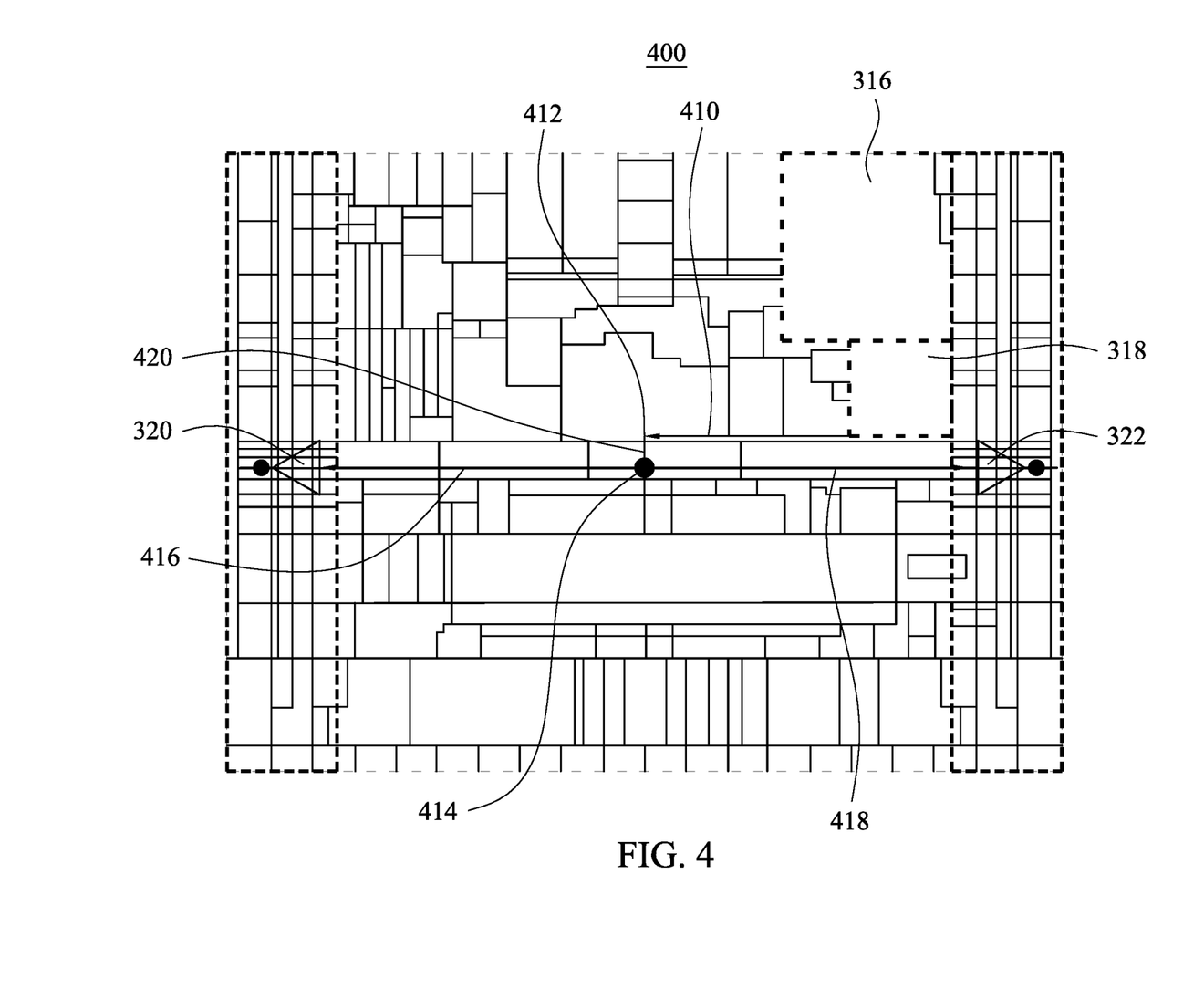
FIG. 4 illustrates an example design layout of a main controller of the memory device of FIG. 3, in accordance with some embodiments.

The main controller 308 can be connected to the word line driver 306. The main controller 308 can include a reset clock generator (RSC) (FIG. 4) and an SAE signal generator (FIG. 4). The main controller 308 can include generating a SAE signal for the sense amplifiers 104 that are disposed in the I/O circuits 312 and 314. During the operation of the memory device 300, an entire row of memory cells 102 can be read with one read command. For example, if a processor (not shown) sends a read command to the memory device 300 at a particular address, the controller for the memory device 300 can process the read command so that an entire row of the memory device 300 is read at the same time and returned to the processor. Alternatively, the controller can return the data from any subset of memory cells within the row or multiple rows (e.g., 2 rows, 4 rows).

The I/O circuits 312 can include I/O circuit 312-1, I/O circuit 312-2, I/O circuit 312-3 . . . I/O circuit 312-$n$. The I/O circuits 314 can include I/O circuit 314-1, I/O circuit 314-2, I/O circuit 314-3 . . . I/O circuit 314-$n$. Each of the I/O circuits 312 and 314 can include, among other things, sense amplifiers 104. Each of the I/O circuits 312-1-312-$n$ and 314-1-314-$n$ can receive as input including, for example, input data D and a write enable signal BWEB and output including, for example, output data Q. During a write operation of the memory device 300, the data that is to be written into the memory device 300 can be transmitted through an input data D line. And when the write enable signal BWEB is transmitted, the corresponding memory cell 102 can write the data from the input data D into the corresponding memory cell 102.

Various circuits and signal lines can be used to model and/or track a memory array so that the main controller 308 can accurately and timely generate signals for the operation of memory device 300. For example, the tracking array 324 can include an array (or column) of SRAM memory cells 102 that is used for timing tracking of the memory device 300. The main controller 308 can include a clock (CLK) input that oscillates between rising and falling on a periodic basis. The CLK signal can be input to the reset clock generator which can be used, among other things, to generate a reset clock (not shown) and a tracking word line (TRKWL) signal.

When the CLK signal rises, the TRKWL signal can rise. The TRKWL line can transmit the TRKWL signal about halfway through the I/O circuits 314 and back to the tracking array 324. The TRKWL signal can emulate a signal routing delay in the memory banks 302 or 304. When the TRKWL signal rises, the tracking bit line (TRKBL) signal can fall, which can emulate a read operation of the memory bank 304. When the TRKBL signal falls, the trigger (TRIG) signal output by the SAE signal generator 318 can rise. The TRIG signal can indicate that the SAE signal generator 318 can safely and/or reliably generate the SAEB signal, having satisfied all of the timing requirements (e.g., the read margins are satisfied). And the SAEB falling can trigger the SAE_L (or GLB_SAE_L) signal and SAE_R (or GLB_SAE_R) signal rising.

As discussed above, each of the sense amplifiers 104 can receive a SAE signal that can enable or activate the sense amplifier 104 in each I/O circuit 312 or 314. The SAE signal can be split within the main controller 308 so that a left SAE signal SAE_L can be transmitted to each of the I/O circuits 312-1-312-n and a right SAE signal SAE_R can be transmitted to each of the I/O circuit 314-1-314-n. The sense amplifier 104 in each of the I/O circuits 312-1-312-n and 314-1-314-n can be connected to a bit line BL and bit line bar BLB that extend from a column of memory cells 102 within the memory banks 302 and 304. Accordingly, the sense amplifier 104 can sense a data value stored in the memory cell 104 within the corresponding column.

FIG. 4 illustrates an example design layout of a main controller 400 of the memory device 300, in accordance with some embodiments. The main controller 400 can include a reset clock generator 316, an SAE signal generator 318, a left buffer 320, a right buffer 322, an SAE signal bar (SAEB or the inverse of the SAE signal) line (or wire) 410, a first node 412, a second node 414, left SAEB (SAEB_L) line 416, and a right SAEB (SAEB_R) line 418. Although the reset clock generator 316 and the SAE signal generator 318 are shown as boxes, but this is for illustrative purposes only, and generators 316 and 318 can include complex circuitry with multiple semiconductor layers.

The reset clock generator 316 can include a circuit that can generate a reset signal that can reset (or clear) the memory device 300. The reset clock generator 316 can include a complex circuit (e.g., tracking circuit) that can be difficult to move from a certain position within the main controller 400. For example, the reset clock generator 316 can track one or both of the memory arrays 302 and 304 and generate various control signals as described with reference to FIG. 3. The reset clock generator 316 can control the timing of the control signals so that the memory device 300 can meet the timing constraints concerning writing to and reading from the memory device 300. In order to minimize delays and accurately track the memory array 302 and/or 304, the reset clock generator 316 can be positioned next to the memory array 302 or 304. In FIG. 4, although the reset clock generator 316 is located adjacent to the memory array 304, the reset clock generator 316 can be located adjacent to the memory array 302.

Similarly, the SAE signal generator 318 can include another complex circuit that can be difficult to move. For example, the SAE signal generator 318 can receive one or more signals from the reset clock generator 316 that can be used to generate among other things, the SAEB signal (or SAE signal, depending on embodiments). Furthermore, in some embodiments, the SAE signal generator 318 can be adjacent to the reset clock generator 316 for various design reasons. Redesigning and/or repositioning the reset clock generator 316 and the SAE signal generator 318 can be challenging and require much manpower and redesigning of other layers. Accordingly, the present disclosure can optimize or raise the performance of the memory device 300 while also minimizing redesign efforts.

The SAE signal generator 318 can generate and output the SAEB signal through the SAEB line 410. The SAEB signal can traverse through the first node 412, the wire 420, and then split at the second node 414. The SAEB signal can then traverse through the SAEB_L line 416, as a SAEB_L signal, and the SAEB_R line 418, as a SAEB_R signal, which are connected at the second node 414. The lengths of the SAEB_L line 416 (L1) and SAEB_R line 418 (L2) can be substantially the same. Accordingly, the RC delay for the SAEB_L line 416 and the RC delay for the SAEB_R line 418 can be substantially the same, and the SAEB signal (and/or the SAE signal) can be transmitted to the I/O circuits 312 and 314 at substantially the same time.

Each of the left buffer 320 and the right buffer 322 can include an inverter that inverts the SAEB signal into an SAE signal. In some embodiments, the left buffer 320 and the right buffer 322 can be included in the main controller 308. In other embodiments, the left buffer 320 and the right buffer 322 can be included in each of the I/O circuits 312 and 314. The output of the left buffer 320 can include the SAE signal that is transmitted to the sense amplifier 104 in the left I/O circuits 312 (e.g., left SAE signal SAE_L), and the output of the right buffer 322 can include the SAE signal that is transmitted to the sense amplifier 104 in the right I/O circuits 314 (e.g., right SAE signal SAE_R). Accordingly, the left SAE signal SAE_L can be transmitted to the sense amplifier 104 in each of the I/O circuit 312 at substantially the same time that the right SAE signal SAE_R is transmitted to the sense amplifier 104 in the corresponding I/O circuit 314, respectively. For example, the left SAE signal SAE_L can arrive at the sense amplifier 104 in the I/O circuit 312-1 at substantially the same time as when the right SAE signal SAE_R arrives at the sense amplifier 104 in the I/O circuit 314-1. As another example, the left SAE signal SAE_L can arrive at the sense amplifier 104 in the I/O circuit 312-n at substantially the same time as when the right SAE signal SAE_R arrives at the sense amplifier 104 in the I/O circuit 314-n. Accordingly, memory device 300 can have an SAE signal that is transmitted to the sense amplifiers 104 on both I/O circuits 312 and 314 with equal (or substantially equal or balanced) RC delays.

As discussed above, optimizing performance without sacrificing low power and low area usage is greatly desired when designing a memory device. One way to increase performance is to decrease the clock-to-q delay Tcd which measures the time from clock rising to the data being available at the output of the memory device. In an SRAM memory device, e.g., memory device 300, the Tcd is at least partially dependent on the read margin (RM). Referring to FIG. 2, the RM is, when the SAE signal SAE transitions to a turn-on voltage, the difference between the voltage at DL_IN and DLB_IN. For example, for the left I/O circuits 312, the left read margin RM_L can be the voltage difference between the voltage at a DLB_IN_L node (DLB_IN node of the left I/O circuits 312) and the voltage at the DL_IN_L node (DL_IN node of the left I/O circuits 312), when the left SAE signal SAE_L is above a certain voltage (e.g., turn-on voltage). As another example, for the right I/O circuits 314, the right read margin RM_R can be the voltage difference between the voltage at the DLB_IN_R node (DLB_IN node of the right I/O circuits 314) and the voltage at the DL_IN_R node (DL_IN node of the right I/O circuits 314), when the right SAE signal SAE_R is above a certain voltage (e.g., turn-on voltage). When the read margins RM_L and RM_R are above a predetermined voltage, the data sensed by the sense amplifiers of the corresponding memory cells is accurate. However, it is desired that the read margins RM_L and RM_R are not too high or too different from each other because that would degrade the performance (e.g., raise the Tcd) of the memory device 300. In some embodiments, by splitting the SAE signal into left SAE signal SAE_L and right SAE signal SAE_R at a node or point that is substantially in the middle between the left and right buffers 320 and 322, the read margins RM_L and RM_R can be substantially the same and reduced at the same time, while still being above the a minimum amount that is required to accurately sense the data.

Figure 5:
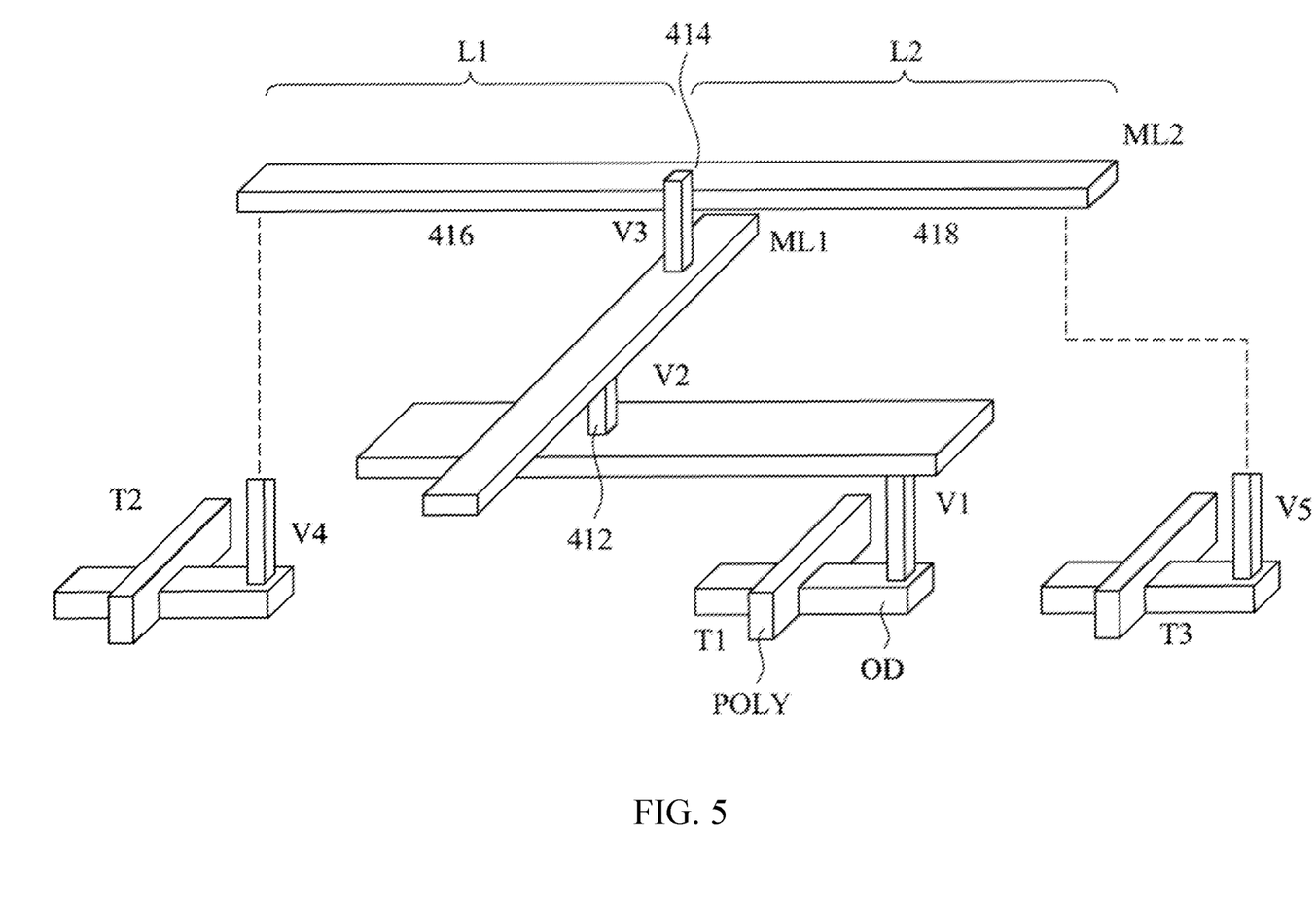
FIG. 5 illustrates a 3-dimensional structure of a portion of a memory device, according to some embodiments.

FIG. 5 illustrates a perspective view of a portion of the memory device 300, according to some embodiments. As shown, the portion of the memory device 300 includes transistors T1, T2, and T3, interconnect structures in respective different metal levels ML0, ML1, and ML2 (hereinafter "interconnect structure ML0," "interconnect structure ML1," "interconnect structure ML2," respectively), and vias V1, V2, V3, V4, and V5. Although the 3D structure only includes portions of the memory device 300, one of ordinary skill in the art will recognize that embodiments are not limited thereto. The transistors T1-T3 in FIG. 5 each include a non-planar transistor (e.g., a FinFET), but the disclosed technology is not limited thereto. For example, the disclosed technology can be applied to planar transistors as well as other types of non-planar transistors such as gate-all-around (GAA) transistors, while remaining within the scope of present disclosure.

The SAE signal generator 318 can include the transistor T1 which outputs the SAEB signal. The transistor T1 can include a gate structure POLY and an active structure (e.g., a fin) OD including a source structure and a drain structure. The SAEB signal can be transmitted to the via V1 which is connected to the interconnect structure ML0. Further, the SAEB signal can be transmitted to the via V2, then to the interconnect structure ML1, and then to the via V3. The node 412 can include the same node 412 from FIG. 4, and the node 414 can include the node 414 from FIG. 4. Because the SAEB signal propagates through some of the higher interconnect structures (e.g., ML2), the interconnect structures of which are sparsely disposed from one another, there can be reduced coupling and in turn RC delays for the SAEB signal.

At the node 414, the SAEB signal can split into the SAEB_L signal and the SAEB_R signal. The SAEB_L signal can be transmitted through the SAEB_L line 416 including the interconnect structure ML2, and the SAEB_R signal can be transmitted through the SAEB_R line 418 including the interconnect structure ML2. The SAEB_L line 416 can have length L1, and the SAEB_R line 418 can have length L2. The SAEB_L signal can then be transmitted through one or more interconnect structures (e.g., interconnect structure ML1) and/or one or more vias (e.g., via V4) to the transistor T2 which can include the transistor M13 included in the sense amplifier 104 in one of the left I/O circuits 312 (e.g., I/O circuit 312-1). Similarly, the SAEB_R signal can be transmitted through one or more interconnect structures (e.g., interconnect structure ML1) and/or one or more vias (e.g., via V5) to the transistor T3 which can include the transistor M13 of the sense amplifier 104 in one of the right I/O circuits 314 (e.g., I/O circuit 314-1). The length L1 can be similar (or the same or substantially the same) as the length L2. Accordingly, the SAEB signal (or the SAE signal) can be transmitted to the sense amplifiers 104 on opposing sides of the main controller 308 at about the same time.

Although FIG. 5 shows that the split happens at node 414 located at the intersection of the via V3 and metal layer ML2, embodiments are not limited thereto. For example, the split can occur on a different interconnect structure that is above the interconnect structure ML2 such as interconnect structure ML3, etc.

Figure 6:
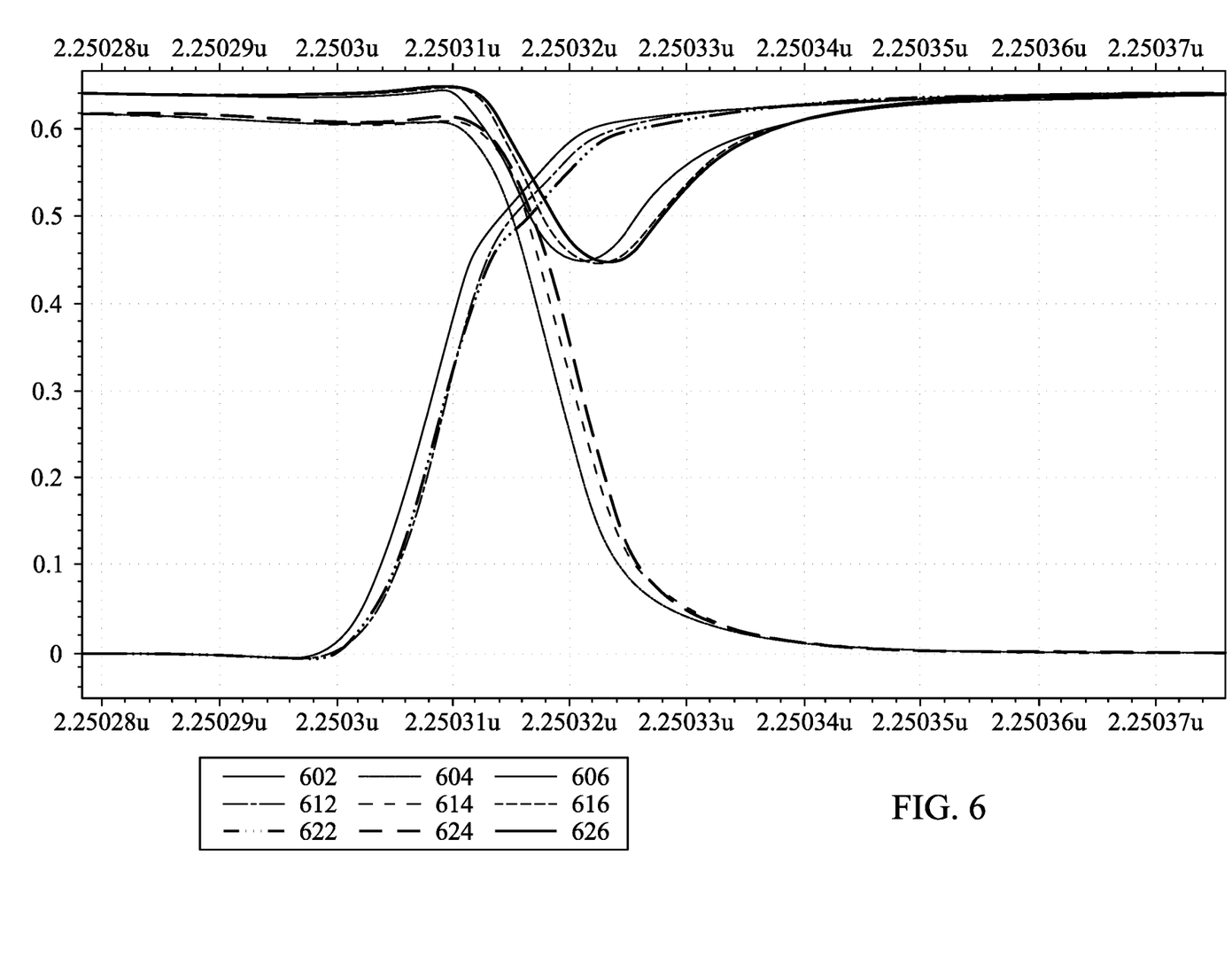
FIG. 6 illustrates a voltage graph of operating a memory device, in accordance with some embodiments.

FIG. 6 illustrates a voltage graph of operating the memory device 300, in accordance with some embodiments. The x-axis is the time, and the y-axis is the voltage. The graph includes first SAE_R line 602, second SAE_R line 612, SAE_L line 622, first DL_IN_R line 604, second DL_IN_R line 614, DL_IN_L line 624, first DLB_IN_R line 606, second DLB_IN_R line 616, and DLB_IN_L line 626. The voltages and times described herein are for illustrative purposes only, and one of ordinary skill will recognize that the values can be higher or lower, depending on embodiments.

As discussed above, the first and second SAE_R and SAE_L lines 602, 612, and 622 illustrate the voltage level of the right and left SAE signals SAE_R and SAE_L as a function of time. The first and second DL_IN_R and DL_IN_L lines 604, 614, and 624 illustrate the voltage level of the right and left DL_IN nodes in the sense amplifier 104 of the left I/O circuits 312 and right I/O circuits 314. The first and second DLB_IN_R and DLB_IN_L lines 606, 616, and 626 illustrate the voltage level of the right and left DLB_IN nodes in the sense amplifier 104 of each of the left I/O circuits 312 and right I/O circuits 314. The DL_IN and DLB_IN nodes are connected to a controller (e.g., a microcontroller, processor, field programmable gate array (FPGA), etc.) and carry the output of the read command in opposite polarities to ensure accurate reading of the data in the memory cell 102.

Typically, the first SAE_R line 602 and the SAE_L line 622 can have a gap because the SAE_R signal switches to (or transitions to or have) a turn-on voltage early compared to the SAE_L signal. Therefore, there can be an imbalance in the SAE_R and SAE_L signals which can result in the Tcd being longer. Referring to FIG. 6, the first SAE_R line 602 can switch to the turn-on voltage earlier than then SAE_L line 622. Then the first DL_IN_R line 604 can transition to a logical 0 much earlier compared to the DL_IN_L line 624, and the first DLB_IN_R line 606 can transition to a logical 1 much earlier compared to the DLB_IN_R line 626. Accordingly, the read margins for both the left and right I/O circuits 312 and 314 can be large. For example, the left read margin RM_L (DLB_IN_L minus DL_IN_L) can be about 32. mV while the right read margin RM_R can be about 29.3 mV. The difference or gap in the read margins is about 3.6 mV. Furthermore, the right read margin RM_R may have a read margin that is too small in order to reliably read from the sensing amplifier 104.

In some embodiments, when the SAEB_L line 416 and the SAEB_R line 418 have substantially the same lengths, the voltage of the SAE_R signal can have the second SAE_R line 612, the voltage at the DL_IN_R node have the second DL_IN_R line 614, and the voltage at the DLB_IN_R node can have the second DLB_IN_R line 616. For example, during the read operation the difference between the voltages of the SAE_R signal and the SAE_L signal, when the lengths L1 and L2 are substantially the same, can be less than the difference between the voltages of the SAE_R signal and the SAE_L signal, when lengths L1 and L2 have a large difference. Accordingly, the gap between the SAE_R signal and the SAE_L signal is reduced. As another example, during the read operation, the difference between the voltages at the DL_IN_R node and the DL_IN_L node, when the lengths L1 and L2 are substantially the same, can be less than the difference between the voltages of the DL_IN_R node and the DL_IN_L node, when lengths L1 and L2 have a large difference. Accordingly, the gap between the voltages at the DL_IN_R node and the DL_IN_L node is reduced. As another example, during the read operation, the difference between the voltages at the DLB_IN_R node and the DLB_IN_L node, when the lengths L1 and L2 are substantially the same, can be less than the difference between the voltages of the DLB_IN_R node and the DLB_IN_L node, when lengths L1 and L2 have a large difference. Accordingly, the gap between the voltages at the DLB_IN_R node and the DLB_IN_L node is reduced.

When the lengths L1 and L2 are substantially the same, the read margin for the left I/O circuits 312 can be changed from about 32.8 mV to about 32.9 mV, and the read margin for the right I/O circuits 314 can be changed from about 29.3 mV to about 32.7 mV. Accordingly, the original read margin gap between the two banks 312 and 314 can be about 3.5 mV (32.8 mV-29.3 mV), but in some embodiments, the gap in the read margins can be reduced to about 0.2 mV (32.9 mV-32.7 mV). Accordingly, when the sense amplifier 104 has a time constraint of at least 30 mV of read margin, the SAE (or SAEB) signal can switch to the turn-on voltage earlier (pushing SAE/SAEB signal to fire earlier) such that the right read margin is reduced to about 30.3 mV and the left read margin is reduced to about 30.1 mV. In other words, the disclosed technology can reduce the gap of the left and right read margins to about 0.2 mV gap, which means the read margins on both the left and right I/O circuits 312 and 314 can be reduced in order to decrease the Tcd on both sides.

In terms of Tcd, when the L1 and L2 are substantially the same, the Tcd for the left memory bank 302 can stay about the same at about 320 ps, before and after the change in the lengths L1 and L2. The Tcd for the right I/O circuits 314 can increase from about 314 ps to about 319 ps because the read margin for the right memory bank 304 increases when the L1 and L2 are substantially the same. And when the SAE (or SAEB) signal is switched earlier (pushing SAE/SAEB signal to fire earlier), the Tcd for both the left and right memory banks 302 and 304 can be reduced to about 315 ps. Accordingly, the Tcd for the memory device 300 can be reduced from about 320 ps (the Tcd for the left memory bank 302) to about 315 ps (Tcd for both the left and right memory banks 302 and 304).

The present technology has been disclosed with reference to the SAE signal, but embodiments are not limited thereto. One of ordinary skill will recognize that the present technology can be applied to other signals that are split for butterfly structures. For example, the present technology can be applied to a bit line pre-charge enable signal (BLEQ) which can be used to enable (or activate) a circuit that outputs a pre-charge signal to the bit lines. The present technology can also be applied for data line pre-charge enable signal (DLEQ) which can be used to enable (or activate) a circuit that outputs pre-charge signal to the data lines. The present technology can further be applied to a read column select signal (DEC_YRB) which can be used select a column of memory cells 102 for a read operation. The present technology can also be applied to a write column select signal (DEC_YWB) which can be used to select a column of memory cells 102 for a write operation.

Figure 7:
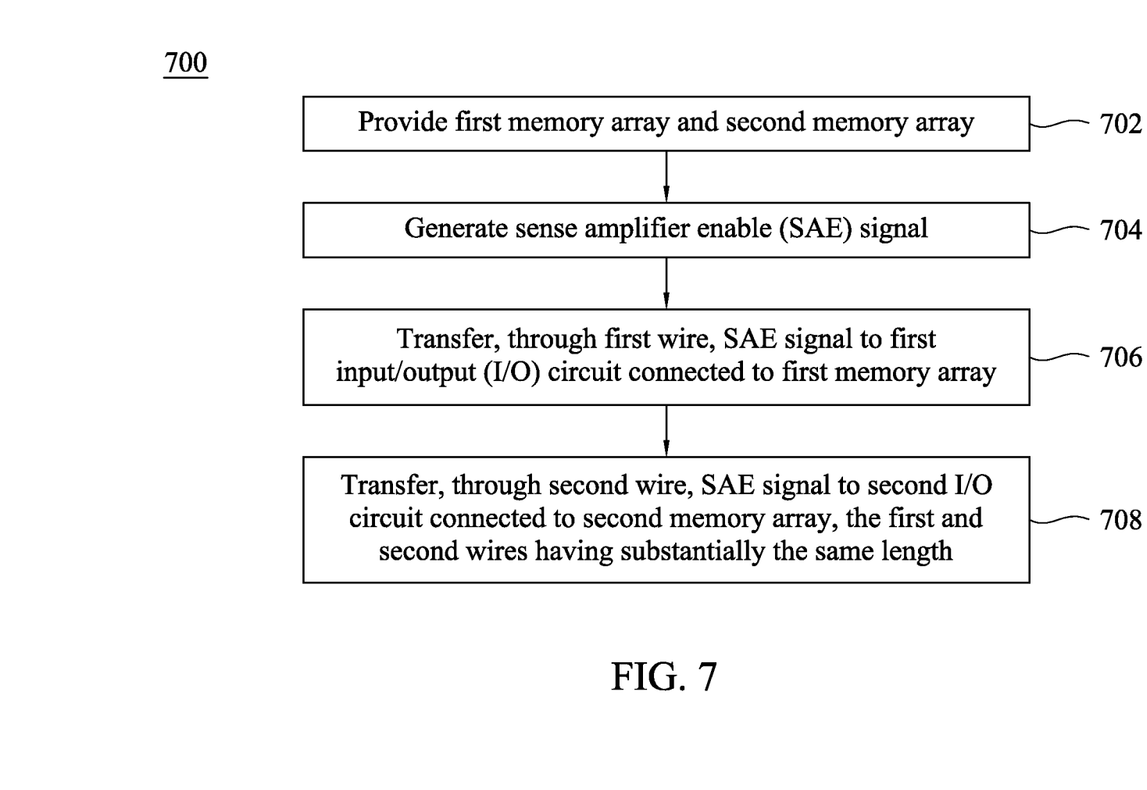
FIG. 7 illustrates a flow chart of a method of operating a memory device, in accordance with some embodiments.

FIG. 7 illustrates a flow chart of a process 700 of operating the memory device 300, in accordance with some embodiments. It should be noted that process 700 is merely an example and is not intended to limit the present disclosure. Accordingly, it is understood that additional steps/operations may be provided before, during, and after process 700 of FIG. 7, and that some other operations may only be briefly described herein.

In brief overview, the process 700 starts with operation 702 of providing a first memory array and a second memory array. Then process 700 can proceed to operation 704 of generating a SAE signal (or SAEB signal). Then process 700 can proceed to operation 706 of transferring, through a first wire, the SAE signal to the first I/O circuit connected to the first memory array. Then process 700 can proceed to operation 708 of transferring, through the second wire, the SAE signal to the second I/O circuit connected to the second memory array, the first and second wires having substantially the same length.

Corresponding to operation 702, the first memory array and the second memory array can be disposed on opposing sides of a controller in a butterfly structure. The first memory array can include the memory bank 302, and the second memory array can include the memory bank 304. The controller can include the word line driver 306 and/or the main controller 308. The main controller can include the reset clock generator 316 and the SAE signal generator 318.

Corresponding to operation 704, the SAE signal generator 318 can generate an SAE (or SAEB) signal. The SAE/SAEB signal can be transmitted through a wire through one or more interconnect structures such as interconnect structure ML0 and/or ML1 (and the corresponding vias). Once the SAE/SAEB signal reaches interconnect structure ML2 (or any interconnect structure above interconnect structure ML2), the signal can split into SAE_L/SAEB_L and SAE_R/SAEB_R signals.

Corresponding to operation 706, the SAE_L/SAEB_L signal can be transferred to an I/O circuit corresponding to the first memory array through a first wire. As discussed above, the first wire can include the interconnect structure ML2. In some embodiments, the SAEB_L signal can be inverted by a buffer in the I/O circuit.

Corresponding to operation 708, the SAE_R/SAEB_R signal can be transferred to an I/O circuit corresponding to the second memory array through a second wire. As discussed above, the second wire can include the interconnect structure ML2. In some embodiments, the SAEB_R signal can be inverted by a buffer in the I/O circuit. The first and second wires can have substantially the same length which can reduce and equalize the RC delays of the first and second wires. Accordingly, the Tcd can be reduced for the memory device.

In some embodiments, the controller can output the SAE/SAEB signal to a third wire (e.g., interconnect structure ML0), which is electrically connected to the first and second wires (e.g., ML2). In some embodiments, the third wire can be substantially parallel to the first and second wires. The third wire can also include a portion that is substantially perpendicular (e.g., interconnect structure ML1).

In one aspect of the present disclosure, a memory device is disclosed. The memory device can include a plurality of memory arrays including a first memory array and a second memory array. The memory device can include a controller including a plurality of buffers including a first buffer connected to the first memory array and a second buffer connected to the second memory array, wherein the first and second memory arrays are disposed on opposing sides of the controller. The memory device can include a plurality of wires including a first wire extending in a first direction and connected to the first buffer, a second wire extending in the first direction and connected to the second buffer, and a third wire connected to the first and second wires and extending in a second direction that is substantially perpendicular to the first direction. The third wire can be electrically connected to the controller, and respective lengths of the first wire and the second wire are substantially the same.

In another aspect of the present disclosure, a memory device is disclosed. The memory device can include a plurality of input/output (I/O) circuits including a first I/O circuit and a second I/O circuit. The memory device includes a first memory array connected to the first I/O circuit and a second memory array connected to the second I/O circuit. The memory device can include a first buffer connected to the first I/O circuit and a second buffer connected to the second I/O circuit. The memory device can include a plurality of wires including a first wire connected to the first and second buffers and a second wire extending substantially perpendicularly from a middle portion of the first wire.

In yet another aspect of the present disclosure, a method of operating a memory device is disclosed. The method can include providing a first memory array and a second memory array, wherein the first and second memory arrays are disposed on opposing sides of a controller. The method can include generating, by the controller, a sense amplifier enable (SAE) signal and transferring, through a first wire, the SAE signal to a first input/output (I/O) circuit connected to the first memory array. The method can include transferring, through a second wire, the SAE signal to a second I/O circuit connected to the second memory array, wherein the first wire and the second wire have substantially the same length.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a first memory array;
   a second memory array;
   a first buffer physically connected to the first memory array through a first interconnect structure that extends in a first direction; and
   a second buffer physically connected to the second memory array through a second interconnect structure that extends in the first direction;
   wherein the first interconnect structure and the second interconnect structure are connected to each other at a point interposed between the first buffer and the second buffer along the first direction, and wherein respective physical lengths of the first interconnect structure and the second interconnect structure along the first direction are substantially the same.

2. The memory device of claim 1, wherein the first interconnect structure and the second interconnect structure are connected to each other as one single interconnect structure extending in the first direction.

3. The memory device of claim 1, further comprising:
   a reset clock generator configured to generate a first signal; and
   a sense amplifier enable (SAE) generator configured to generate a second signal based on the first signal.

4. The memory device of claim 3, wherein the reset clock generator and the SAE generator are interposed between the first buffer and the second buffer.

5. The memory device of claim 1, wherein the point is coupled to a third interconnect structure extending in a second direction substantially perpendicular to the first direction.

6. The memory device of claim 5, wherein the first and second interconnect structures are disposed in a first metal layer, and the third interconnect structure is disposed in a second metal layer.

7. The memory device of claim 6, wherein the second metal layer is vertically disposed below the first metal layer.

8. The memory device of claim 6, wherein the first and second interconnect structures and connected to the third interconnect structure through a single via structure.

9. The memory device of claim 1, further comprising a first sense amplifier to amplify a signal from the first memory array and a second sense amplifier to amplify a signal from the second memory array, wherein the first buffer connects the first interconnect structure to the first sense amplifier and the second buffer connects the second interconnect structure to the second sense amplifier.

10. The memory device of claim 1, wherein the first memory array and second memory array each include a plurality of static random access memory (SRAM) cells.

11. A memory device, comprising:
    a first memory array;
    a first input/output (I/O) circuit physically disposed next to the first memory array;
    a second memory array;
    a second I/O circuit physically disposed next to the second memory array;
    a first buffer physically connected to the first I/O circuit through a first interconnect structure that extends in a first direction; and
    a second buffer physically connected to the second I/O circuit through a second interconnect structure that extends in the first direction;
    wherein the first interconnect structure and the second interconnect structure are connected to each other at a point interposed between the first buffer and the second buffer along the first direction, and wherein respective physical lengths of the first interconnect structure and the second interconnect structure along the first direction are substantially the same.

12. The memory device of claim 11, wherein the first interconnect structure and the second interconnect structure are connected to each other as one single interconnect structure extending in the first direction.

13. The memory device of claim 11, further comprising:
    a reset clock generator configured to generate a first signal; and
    a sense amplifier enable (SAE) generator configured to generate a second signal based on the first signal;
    wherein the reset clock generator and the SAE generator are interposed between the first buffer and the second buffer.

14. The memory device of claim 13, wherein the second signal is transmitted to the first buffer and the second buffer through the first interconnect structure and the second interconnect structure that have the same length, respectively.

15. The memory device of claim 11, wherein the first memory array and second memory array each include a plurality of static random access memory (SRAM) cells.

16. The memory device of claim 11, wherein the point is coupled to a third interconnect structure extending in a second direction substantially perpendicular to the first direction.

17. The memory device of claim 16, wherein the first and second interconnect structures are disposed in a first metal layer, and the third interconnect structure is disposed in a second metal layer, and wherein the second metal layer is vertically disposed with respect to the first metal layer.

18. The memory device of claim 16, wherein the first and second interconnect structures and connected to the third interconnect structure through a single via structure.

19. A memory device, comprising:
- a first memory array;
- a first input/output (I/O) circuit physically disposed next to the first memory array;
- a second memory array;
- a second I/O circuit physically disposed next to the second memory array;
- a first buffer physically connected to the first I/O circuit through a first interconnect structure that extends in a first direction; and
- a second buffer physically connected to the second I/O circuit through a second interconnect structure that extends in the first direction;
- wherein the first and second interconnect structures are connected to each other at a point that is interposed between the first buffer and the second buffer along the first direction, and coupled to a third interconnect structure extending in a second direction substantially perpendicular to the first direction; and
- wherein respective physical lengths of the first interconnect structure and the second interconnect structure along the first direction are substantially the same.

20. The memory device of claim 19, wherein the first memory array and second memory array each include a plurality of static random access memory (SRAM) cells.

* * * * *